(12) United States Patent
Nakajima et al.

(10) Patent No.: US 11,817,674 B2
(45) Date of Patent: Nov. 14, 2023

(54) SEMICONDUCTOR OPTICAL DEVICE AND METHOD FOR MANUFACTURING THE SAME

(71) Applicant: Lumentum Japan, Inc., Kanagawa (JP)

(72) Inventors: Ryosuke Nakajima, Kanagawa (JP); Yasushi Sakuma, Tokyo (JP); Shigetaka Hamada, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 374 days.

(21) Appl. No.: 17/247,317

(22) Filed: Dec. 7, 2020

(65) Prior Publication Data

US 2021/0408760 A1    Dec. 30, 2021

(30) Foreign Application Priority Data

Jun. 25, 2020 (JP) .................................. 2020-109389
Aug. 20, 2020 (JP) .................................. 2020-139167

(51) Int. Cl.
| | |
|---|---|
| *H01S 5/028* | (2006.01) |
| *H01S 5/042* | (2006.01) |
| *H01S 5/22* | (2006.01) |
| *H01S 5/34* | (2006.01) |
| *G02F 1/017* | (2006.01) |

(52) U.S. Cl.
CPC ........ *H01S 5/04256* (2019.08); *H01S 5/0282* (2013.01); *H01S 5/22* (2013.01); *G02F 1/017* (2013.01); *G02F 2202/102* (2013.01); *H01S 5/34* (2013.01); *H01S 2301/176* (2013.01)

(58) Field of Classification Search
CPC ...... H01S 5/04256; H01S 5/0282; H01S 5/22; H01S 2301/176
See application file for complete search history.

(56) References Cited

U.S. PATENT DOCUMENTS

| | | | | |
|---|---|---|---|---|
| 2004/0218646 | A1* | 11/2004 | Mihashi | H01S 5/2231 372/46.01 |
| 2005/0195876 | A1* | 9/2005 | Sato | H01S 5/0234 372/87 |
| 2006/0018358 | A1* | 1/2006 | Kadowaki | H01S 5/04254 372/87 |

FOREIGN PATENT DOCUMENTS

| | | |
|---|---|---|
| JP | 2006032819 A | 2/2006 |
| JP | 2011009294 A | 1/2011 |

* cited by examiner

*Primary Examiner* — Yuanda Zhang
(74) *Attorney, Agent, or Firm* — Harrity & Harrity, LLP

(57) ABSTRACT

A semiconductor optical device may include a semiconductor substrate; a compound semiconductor layer on the semiconductor substrate; an additional insulating film on the pedestal portion of the compound semiconductor layer, the additional insulating film having an upper surface and a side surface at an inner obtuse angle between them; a passivation film covering the compound semiconductor layer and the additional insulating film except at least part of the mesa portion, the passivation film having a protrusion raised by overlapping with the additional insulating film; a mesa electrode on the at least part of the mesa portion; a pad electrode on the passivation film within the protrusion; and an extraction electrode on the passivation film, the extraction electrode being continuous within and outside the protrusion, the extraction electrode connecting the pad electrode and the mesa electrode, the extraction electrode being narrower in width than the pad electrode.

7 Claims, 12 Drawing Sheets

SEMICONDUCTOR OPTICAL DEVICE AND METHOD FOR MANUFACTURING THE SAME

CROSS-REFERENCE TO RELATED APPLICATIONS

The present application claims priority from Japan Patent Applications JP2020-109389 filed on Jun. 25, 2020 and JP2020-139167 filed on Aug. 20, 2020, the contents of which are hereby incorporated by reference into this application.

TECHNICAL FIELD

Some implementations described herein relate to a semiconductor optical device and a method for manufacturing a semiconductor optical device.

BACKGROUND

High-speed response is useful for optical semiconductor devices used for optical communication. To improve the high-speed response, some techniques reduce the parasitic capacitance. A semiconductor optical device may have a pad electrode for electrical connection with the outside. The pad electrode may have a larger area than other electrodes and causes a large parasitic capacitance.

Some techniques use an insulating film interposed between a pad electrode and a passivation film to reduce parasitic capacitance. The insulating film is locally formed, and an extraction electrode extends from the pad electrode beyond the insulating film. Since the edge of the insulating film is a shape that rises steeply, there is a possibility of breaking the extraction electrode. An insulating layer may have a step on the surface.

SUMMARY

Some implementations described herein are aimed at reducing the parasitic capacitance of the pad electrode and reducing a possibility of breaking the extraction electrode.

A semiconductor optical device may include a semiconductor substrate; a compound semiconductor layer on the semiconductor substrate, the compound semiconductor layer having a mesa portion extending in a stripe shape in a first direction, the compound semiconductor layer having a pedestal portion adjacent to the mesa portion in a second direction perpendicular to the first direction; an additional insulating film on the pedestal portion of the compound semiconductor layer, the additional insulating film having an upper surface and a side surface at an inner obtuse angle between the upper surface and the side surface; a passivation film covering the compound semiconductor layer and the additional insulating film except at least part of the mesa portion, the passivation film having a protrusion raised by overlapping with the additional insulating film; a mesa electrode on the at least part of the mesa portion; a pad electrode on the passivation film within the protrusion; and an extraction electrode on the passivation film, the extraction electrode being continuous within and outside the protrusion, the extraction electrode connecting the pad electrode and the mesa electrode, the extraction electrode being narrower in width than the pad electrode.

This enables reduction of parasitic capacitance of the pad electrode by the presence of the additional insulating film. Further, the inner angle between the upper surface and the side surface of the additional insulating film may be obtuse, corresponding to this shape, the protrusion of the passivation film is formed, thereby reducing a possibility of breaking the extraction electrode.

A method for manufacturing a semiconductor optical device may include: forming a compound semiconductor layer on a semiconductor substrate, the compound semiconductor layer having a mesa portion extending in a stripe shape in a first direction, the compound semiconductor layer having a pedestal portion adjacent to the mesa portion in a second direction perpendicular to the first direction; forming an additional insulating film on the pedestal portion of the compound semiconductor layer, the additional insulating film having an upper surface and a side surface at an inner obtuse angle between the upper surface and the side surface; forming a passivation film by chemical vapor deposition, the passivation film covering the compound semiconductor layer and the additional insulating film except at least part of the mesa portion, the passivation film having a protrusion raised by overlapping with the additional insulating film; and forming an electrode, the electrode including a mesa electrode on the at least part of the mesa portion, the electrode including a pad electrode on the passivation film within the protrusion, the electrode including an extraction electrode on the passivation film, the extraction electrode being continuous within and outside the protrusion, the extraction electrode connecting the pad electrode and the mesa electrode, the extraction electrode being narrower in width than the pad electrode.

This enables reduction of parasitic capacitance of the pad electrode by the presence of the additional insulating film. Further, the inner angle between the upper surface and the side surface of the additional insulating film is obtuse, corresponding to this shape, the protrusion of the passivation film is formed, thereby reducing possibility of breaking the extraction electrode.

DETAILED DESCRIPTION

Figure 1:
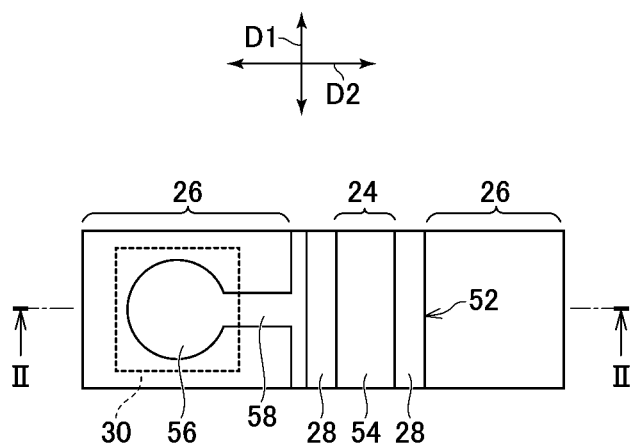
FIG. 1 is a plan view of a semiconductor optical device according to an implementation.

Hereinafter, with reference to Drawings, implementations are described specifically and in detail. In all the drawings, the same members are denoted by the same reference numerals and have the same or equivalent functions, and a repetitive description thereof will be omitted. The size of the figure does not necessarily coincide with the magnification.

Figure 2:
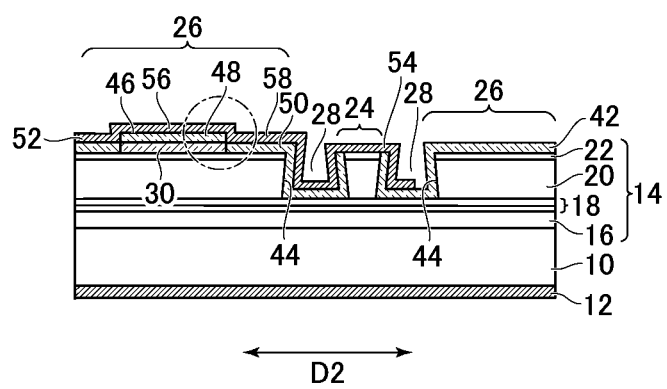
FIG. 2 is a II-II cross-sectional view of the semiconductor optical device in FIG. 1.

FIG. 1 is a plan view of a semiconductor optical device according to an implementation. FIG. 2 is a II-II cross-sectional view of the semiconductor optical device in FIG. 1. The semiconductor optical device is a ridge-type semiconductor laser.

The semiconductor optical device has a semiconductor substrate 10. The semiconductor substrate 10 is an n-type InP substrate, a p-type InP substrate, or a semi-insulating semiconductor substrate. The back surface of the semiconductor substrate 10 has a lower electrode 12 (e.g., a cathode) formed thereon. The lower electrode 12 is formed of some layers such as a three-layer structure of a Ti layer, a Pt layer, and an Au layer.

The semiconductor optical device has a compound semiconductor layer 14. The compound semiconductor layer 14 is composed of some layers on the semiconductor substrate 10. The bottom layer of the layers is a lower cladding layer 16. The lower cladding layer 16 is the same as the semiconductor substrate 10 in the conductivity type (e.g., n-type). Above the lower cladding layer 16 is an active layer 18. The active layer 18 is composed of a multi-quantum well layer and optical confinement layers over and under it. On the active layer 18 is an upper cladding layer 20. The conductivity type of the upper cladding layer 20 (e.g., p-type) is opposite to the conductivity type of the semiconductor substrate 10 (e.g., n-type). Between the active layer 18 and the upper cladding layer 20, a diffraction grating is formed, and another semiconductor layer (e.g., etching stop layer) may be formed. Above the upper cladding layer 20 is a contact layer 22.

The upper cladding layer 20 and the contact layer 22 are separated into some portions. The compound semiconductor layer 14 has a mesa portion 24 in a stripe shape extending in a first direction D1. The mesa portion 24 is composed of part of the upper cladding layer 20 and part of the contact layer 22. There is the active layer 18 under the mesa portion 24.

The compound semiconductor layer 14 has a pedestal portion 26 adjacent to the mesa portion 24 in a second direction D2 perpendicular to the first direction D1. There is a pedestal 26 on each of both sides of the mesa 24. One (left side) of the pedestal portions 26 is larger than the other (right side) of the pedestal portions 26. The pedestal portion 26 is composed of part of the upper cladding layer 20 and part of the contact layer 22. The pedestal portion 26 and the mesa portion 24 are separated by a groove 28.

Figure 3:
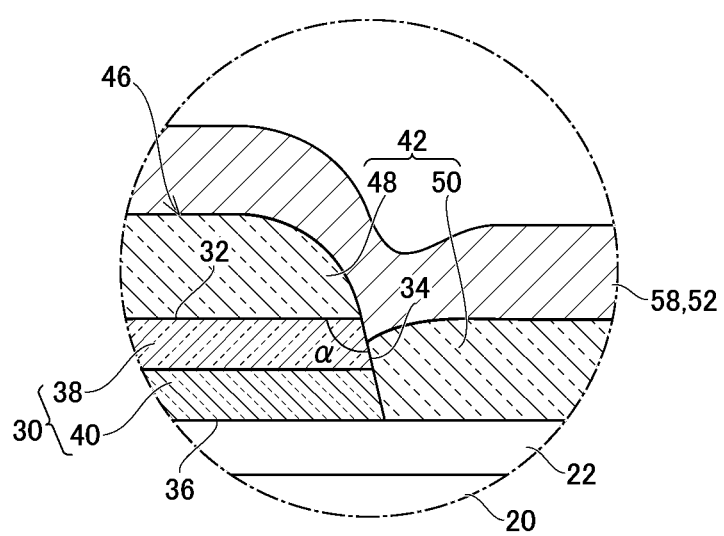
FIG. 3 is an enlarged view of a portion surrounded by a dashed line in FIG. 2.

FIG. 3 is an enlarged view of a portion surrounded by a dashed line in FIG. 2. The semiconductor optical device has an additional insulating film 30. The additional insulating film 30 is locally formed on the contact layer 22. The additional insulating film 30 has an upper surface 32 and a side surface 34. The inner angle α between the upper surface 32 and the side surface 34 is obtuse. The additional insulating film 30 has a trapezoidal shape in a longitudinal section because the upper surface 32 is smaller than the lower surface 36. The additional insulating film 30 is on the larger one (left side in FIG. 2) of the pedestal portions 26. The additional insulating film 30 is composed of some laminated layers. The upper layer 38 is, for example, an $SiO_2$ film. Since the $SiO_2$ film has low adhesiveness to the compound semiconductor layer 14 (contact layer 22), a PSG (Phosphorus Silicon Glass) film is disposed as a lower layer 40 to secure adhesiveness.

The semiconductor optical device includes a passivation film 42. The passivating film 42 is composed of some laminated layers such as a PSG film and an $SiO_2$ film. The passivation film 42 is equivalent in thickness to the additional insulating film 30.

The passivation film 42 covers the compound semiconductor layer 14 and the additional insulating film 30, and also covers an inner surface 44 (e.g., end surface of the upper cladding layer 20, end surface of the contact layer 22) and a bottom surface (e.g., part of an upper surface of the active layer 18) of the groove 28. The passivation film 42 covers a side surface of the mesa portion 24 but has an opening so as to avoid (expose) part (e.g., upper surface) of the mesa portion 24. The upper surface of the mesa portion 24 is part of the contact layer 22.

The passivation film 42 has a protrusion 46 that is raised by overlapping with the additional insulating film 30. The passivation film 42 at the protrusion 46 is not in contact with the compound semiconductor layer 14 (contact layer 22). The passivation film 42 includes a first portion 48 in contact with the upper surface 32 of the additional insulating film 30. The passivation film 42 includes a second portion 50 lower than the first portion 48 and in contact with the side surface 34 of the additional insulating film 30. In some implementations, the passivation film 42 may be a passivation layer. In some implementations the insulating film 30 may be an insulating layer. The second portion 50 is in contact with the compound semiconductor layer 14 (contact layer 22). The first portion 48 and the second portion 50 are at least partially separated, as shown in FIG. 3. For example, the first portion 48 may be completely separated from the second portion 50 and located within the upper surface 32 of the additional insulating film 30. In this case, the first portion 48 is island-shaped inside the second portion 50. Alternatively, a slit may be discontinuously formed around the first portion 48.

The semiconductor optical device has an upper electrode 52 (e.g., anode). The upper electrode 52 is composed of some layers such as a three-layer structure of a Ti layer, a Pt layer, and an Au layer, and may have an overall uniform structure. The upper electrode 52 is on the passivation film 42 and insulated from the compound semiconductor layer 14 except for its part (mesa portion 24).

The upper electrode 52 has a mesa electrode 54. The mesa electrode 54 extends in the first direction D1. The mesa electrode 54 is on at least part (which the passivation film 42 does not cover) of the mesa portion 24. The mesa electrode 54 is in contact with and electrically connected to the upper surface of the mesa portion 24 (contact layer 22) through the opening of the passivation film 42.

The upper electrode 52 has a pad electrode 56. The pad electrode 56 is on the larger one (left side in FIG. 2) of the pedestal portions 26. The pad electrode 56 is located within the protrusion 46 (or additional insulating film 30) and on the passivation film 42. The pad electrode 56 is, for electrical connection with the outside, a region where an unillustrated wire is bonded. The planar shape of the pad electrode 56 may be circular, square, rounded square, or other polygonal. Since the pad electrode 56 has a larger area than the other portions of the upper electrode 52, the parasitic capacitance is large. However, since the passivating film 42 and the additional insulating film 30, made of materials (PSG/SiO$_2$) having a lower dielectric constant than semiconductors, are laminated below the pad electrodes 56, the parasitic capacitance can be reduced.

The upper electrode 52 has an extraction electrode 58. The extraction electrode 58 is formed continuously within and outside the protrusion 46 (or additional insulating film 30), and on the passivation film 42. The extraction electrode 58 connects the pad electrode 56 and the mesa electrode 54. The connection portion between the extraction electrode 58 and the pad electrode 56 is within the protrusion 46 (or additional insulating film 30). The connection portion of the extraction electrode 58 and the mesa electrode 54 is outside the protrusion 46 (or additional insulating film 30). The extraction electrode 58 extends in the second direction D2 and is narrower in width in the first direction D1 than the pad electrode 56.

FIGS. 4 to 8 are diagrams of one or more methods for manufacturing a semiconductor optical device according to an implementation described herein. In the present implementation, to perform multiple manufacturing of the semiconductor optical devices, a semiconductor substrate 10 in a wafer shape is prepared.

Figure 4:
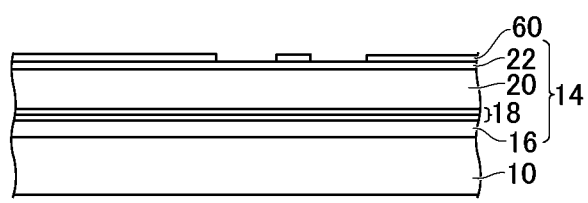
FIG. 4 is a diagram of a method for manufacturing the semiconductor optical device according to an implementation.

As shown in FIG. 4, the compound semiconductor layer 14 is formed on the semiconductor substrate 10. The MOCVD (Metal Organic Chemical Vapor Deposition) is applied to form it. More specifically, the lower cladding layer 16, the active layer 18, the upper cladding layer 20, and the contact layer 22 are formed in this order. After forming the diffraction grating (not shown) in the active layer 18, the upper cladding layer 20 may be formed. Subsequently, an etching mask 60 is formed from an oxide film such as a SiO$_2$ film by CVD (Chemical Vapor Deposition).

Figure 5:
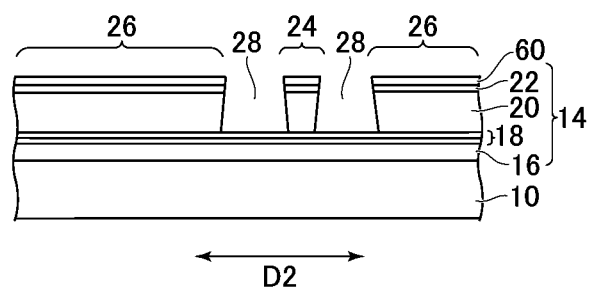
FIG. 5 is a diagram of a method for manufacturing the semiconductor optical device according to an implementation.

As shown in FIG. 5, a groove 28 is formed in the compound semiconductor layer 14 by wet etching using a mixed solution of hydrochloric acid and phosphoric acid. The groove 28 separates the contact layer 22 and the upper cladding layer 20 into some portions. The mesa portion 24 extending in the stripe shape in the first direction D1 (FIG. 1) is formed between a pair of grooves 28. The pedestal portion 26 is formed adjacent to the mesa portion 24 in the second direction D2 perpendicular to the first direction D1. In the second direction D2, the width of the upper surface of the mesa portion 24 is about 2.0 µm, the width of the groove 28 is about 10 µm. Thereafter, the etching mask 60 is removed.

Figure 6:
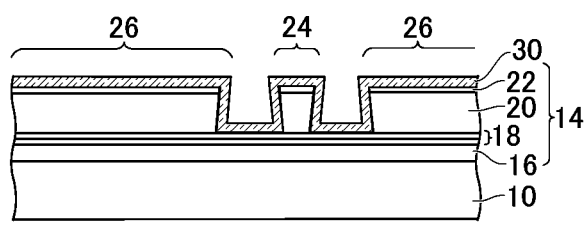
FIG. 6 is a diagram of a method for manufacturing the semiconductor optical device according to an implementation.

As shown in FIG. 6, by chemical vapor deposition, the additional insulating film 30 having a thickness of 0.5 µm, for example, is formed on the surface (including the inner surface 44 and the bottom surface of the groove 28) of the compound semiconductor layer 14. The additional insulating film 30 is formed of some layers. For example, as shown in FIG. 3, the lower layer 40 is formed from PSG and the upper layer 38 is formed from SiO$_2$.

Figure 7:
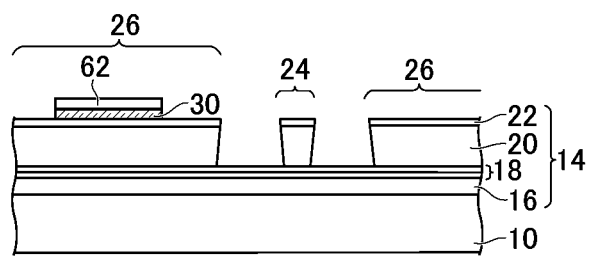
FIG. 7 is a diagram of a method for manufacturing the semiconductor optical device according to an implementation.

As shown in FIG. 7, a resist mask 62 is used to dry etch the additional insulating film 30. Its etchant is C$_2$F$_6$. Thus, the additional insulating film 30 is patterned on the pedestal portion 26 of the compound semiconductor layer 14. The dry etching being applied herein, the side surface 34 of the additional insulating film 30 is as shown in FIG. 3. That is, the inner angle α between the upper surface 32 and the side surface 34 of the additional insulating film 30 is obtuse. Incidentally, the additional insulating film 30 is square in a plan view. Thereafter, the resist mask 62 is removed.

Figure 8:
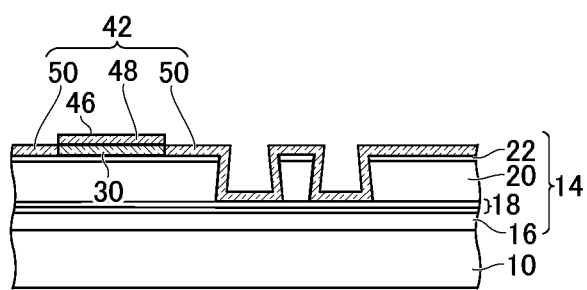
FIG. 8 is a diagram of a method for manufacturing the semiconductor optical device according to an implementation.

As shown in FIG. 8, the passivation film 42 is formed by chemical vapor deposition. The passivation film 42 is formed of some layers; for example, the lower layer is formed from PSG, and the upper layer is formed from SiO$_2$. The passivation film 42 is formed so as to cover the compound semiconductor layer 14 and the additional insulating film 30. As a result, the passivation film 42 has the protrusion 46 raised by overlapping with the additional insulating film 30.

As shown in FIG. 3, the film materials for the chemical vapor deposition are, so as not to protrude above the side surface 34 of the additional insulating film 30, deposited on the upper surface 32 of the additional insulating film 30. This is considered to be because the film materials deposited on the upper surface 32 of the additional insulating film 30 are migrated, along the side surface 34 from the upper surface 32 of the additional insulating film 30, on the contact layer 22.

The film materials are deposited on the upper surface 32 to form the first portion 48, and are deposited around the additional insulating film 30 to form the second portion 50. The step of forming the passivation film 42 ends with a thickness at which the second portion 50 does not contact the first portion 48 at least partially. For example, the passivation film 42 is formed to be equivalent in thickness (e.g., 0.5 µm) to the additional insulating film 30. Thus, it is possible to suppress the stress on the semiconductor layer.

As shown in FIG. 2, the opening is formed in the passivation film 42 on part of the mesa portion 24. Etching is applied to the formation. As a result, the contact layer 22 can be exposed on the mesa portion 24. Thereafter, as shown in FIGS. 1 and 2, the upper electrode 52 is formed. Formation of the upper electrode 52 is performed by forming an electrode film by electron beam evaporation and etching it. The electrode film is formed of some layers (Ti layer, Pt layer, Au layer).

The upper electrode 52 includes the mesa electrode 54 on at least part of the mesa portion 24, the pad electrode 56 within the protrusion 46 and on the passivation film 42, and the extraction electrode 58 being continuous within and outside the protrusion 46 and on the passivation film 42, connecting the pad electrode 56 and the mesa electrode 54, and being thinner in width than the pad electrode 56.

As shown in FIG. 3, since a height difference is formed by the presence or absence of the additional insulating film 30, the passivation film 42 thereon may be broken. However, since the inner angle α between the upper surface 32 and the side surface 34 of the additional insulating film 30 is obtuse, the extraction electrode 58 formed thereon gently slopes downward and is not broken.

Thereafter, the semiconductor substrate 10 is grinded from the back surface to have a desired thickness, the lower electrode 12 is formed, through a process such as electrode alloy, and the wafer-like semiconductor substrate 10 is cut for each optical semiconductor device.

Figure 9:
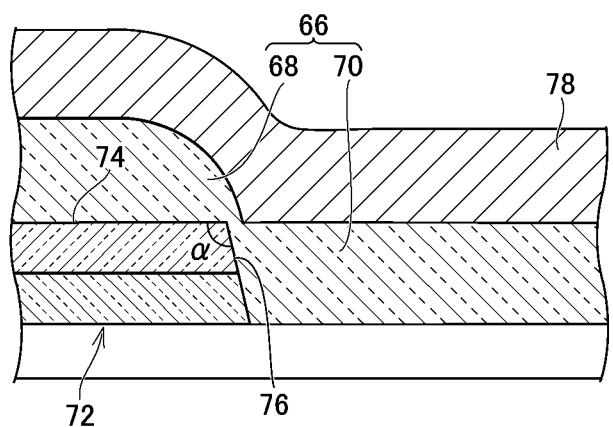
FIG. 9 is a cross-sectional view of an additional insulating film and a passivation film according to an implementation.

FIG. 9 is a cross-sectional view of an additional insulating film and a passivation film according to a variation. In the variation, the step of forming the passivation film 66 continues until the second portion 70 has a thickness to be entirely in contact with (leading to) the first portion 68. As a result, the first portion 48 and the second portion 70 are entirely continuous and integrated without a break. Alternatively, the additional insulating film 72 and the passivation film 66 may vary in thickness by error, whereby the passivation film 66 is entirely continuous without a break. Even in such a structure, if the inner angle α between the upper surface 74 and the side surface 76 of the additional insulating film 72 is obtuse, the passivation film 66 is formed such that the surface gently slopes, and the extraction electrode 78 thereon also has a shape gently sloping without breaking.

Figure 10:
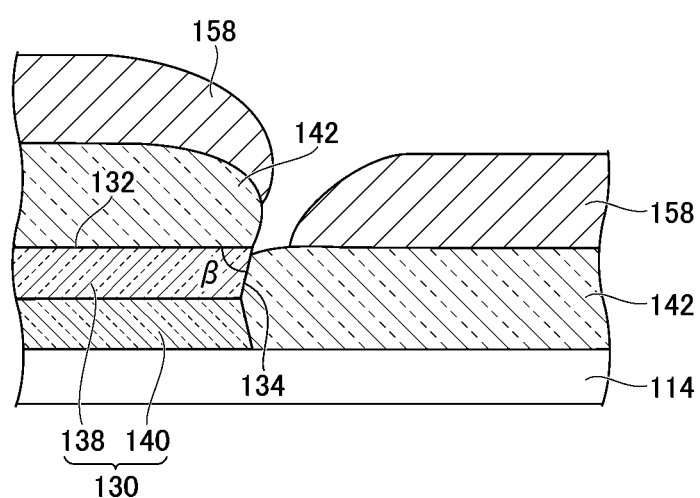
FIG. 10 is a cross-sectional view of an additional insulating film and a passivation film according to an example.

FIG. 10 is a cross-sectional view of an additional insulating film and a passivation film according to an example. In the process of forming the additional insulating film 130, a lower layer 140 (PSG film) and an upper layer 138 (SiO$_2$ film) are formed on the entire surfaces of the compound semiconductor layers 114, and then these are patterned to form the additional insulating film 130. When patterning is performed by wet etching, due to the difference in the etching rate of the lower layer 140 and the upper layer 138, by side etching, recesses are formed on the side surface 134 of the additional insulating film 130. Therefore, the inner angle β between the upper surface 132 and the side surface 134 of the additional insulating film 130 is acute.

The film materials, deposited by chemical vapor deposition on the additional insulating film 130 in this shape, tend to move onto the contact layer 22 by migration, but because of the acute angle between the upper surface 132 and the side surface 134, it is difficult to move along the side surface 134, and the passivation film 142 has a shape protruding from the edge of the upper surface 132 of the additional insulating film 130, under the impact of the surface tension. By forming the extraction electrode 158 on the passivation film 142 as described above, the protruding portion of the passivation film 142 becomes an eaves during deposition of the metal film. As a result, the extraction electrode 158 is broken by separating a portion on the additional insulating film 130 from another portion outside it. Or, even with partial connection, due to its thinness, the pad electrode is likely to be peeled during wire bonding.

If the passivation film 142 is formed to have a thickness of two times or more of that of the additional insulating film 130, the passivation film 142 is entirely continuous, and the extraction electrode 158 is also continuous. However, if the passivation film 142 is too thick, the stress to the compound semiconductor layer 114 increases, which is not preferable in terms of characteristics and reliability. Similarly, making the extraction electrode 158 thicker may improve the connectivity but lead to undesired increase of stress from the metal film.

Figure 11:
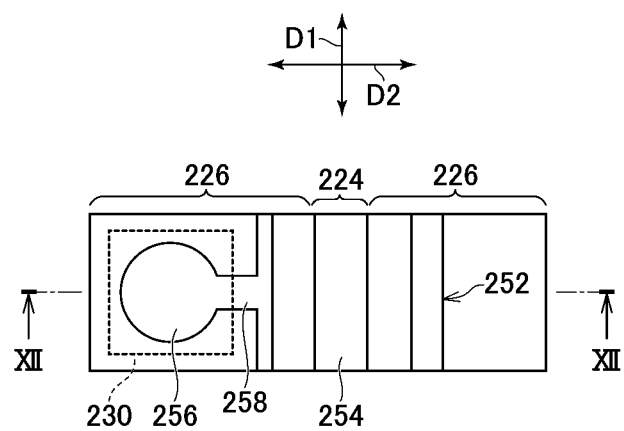
FIG. 11 is a plan view of a semiconductor optical device according to an implementation.
Figure 12:
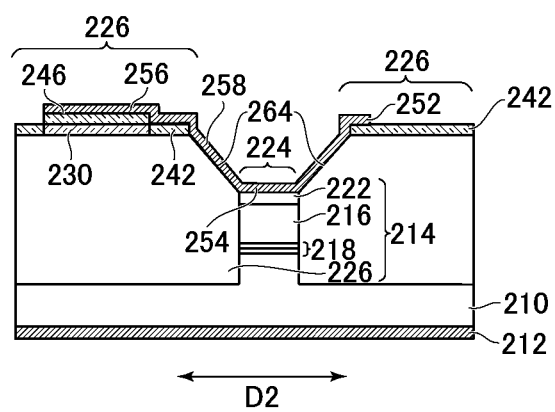
FIG. 12 is a XII-XII cross-sectional view of the semiconductor optical device in FIG. 11.

FIG. 11 is a plan view of a semiconductor optical device according to an implementation. FIG. 12 is a XII-XII cross-sectional view of the semiconductor optical device shown in FIG. 11. The semiconductor optical device is an electro-absorption modulator and has a buried hetero (BH) structure.

The semiconductor optical device has a semiconductor substrate 210 (e.g., n-type InP substrate). On the back surface of the semiconductor substrate 210, there is a lower electrode 212 (e.g., cathode). The semiconductor optical device has a compound semiconductor layer 214 on the semiconductor substrate 210.

The compound semiconductor layer 214 has a mesa portion 224 in a stripe extending in the first direction D1 (optical axis direction). The mesa portion 224 is composed of an active layer 218, a cladding layer 216, and a contact layer 222, laminated in this order from the semiconductor substrate 210. The active layer 218 includes a multiple quantum well layer and there are optical light confinement layers over and under the active layer 218 to serve as an absorption layer.

The compound semiconductor layer 214 has a pedestal portion 226 adjacent to the mesa portion 224 in the second direction D2 perpendicular to the first direction D1. The pedestal portion 226 is located on each of both sides of the mesa portion 224, and is an embedded layer of the mesa portion 224. That is, the pedestal portion 226 is in contact with the side surface of the mesa portion 224. One (left side in FIG. 11) of the pedestal portions 226 is larger than the other (right in FIG. 11) of the pedestal portions 226. The pedestal portion 226 has an inclined surface 264 adjacent to the upper surface of the mesa portion 224. The lower end of the inclined surface 264 is adjacent to the upper surface of the mesa portion 224. The inclined surface 264 slopes so as to be higher in a direction away from the mesa portion 224.

The details of the additional insulating film 230 are as described in an aforementioned implementation. The passivation film 242 has the protrusion 246 raised by overlapping with the additional insulating film 230. The passivation film 242 covers the compound semiconductor layer 214 (upper surface of the pedestal portion 226) and the additional insulating film 230. The passivation film 242 does not cover the mesa portion 224 (whole) and does not cover the inclined surface 264 of the pedestal portion 226. Other details of the passivation film 242 are as described in the first implementation.

On the passivation film 242 is the upper electrode 252 (e.g., anode). The upper electrode 252 entirely has a uniform structure such as a three-layer structure of a Ti layer, a Pt layer, and an Au layer. The mesa electrode 254 is on at least part (e.g., entire upper surface) of the mesa portion 224 and in contact with the mesa portion 224 (contact layer 222). The mesa electrode 254 extends in the first direction D1 (the direction in which the mesa portion 224 extends). The end of the mesa portion 224 in the width direction (second direction D2) may be in contact with the inclined surface 264 of the pedestal portion 226. The pad electrode 256 is located within the protrusion 246 and on the passivation film 242 (or above the additional insulating film 230). The pad electrode 256 is above the larger one (left in FIG. 11) of the pedestals 226. Other details of the pad electrode 256 are as described above.

The extraction electrode 258 is continuous within and outside the protrusion 246 and on the passivation film 242 to connect the pad electrode 256 and the mesa electrode 254, and is thinner in width than the pad electrode 256. A portion of the extraction electrode 258 may be on the inclined surface 264 of the pedestal 226 and may be in contact with the inclined surface 264. Other details of the extraction electrode 258 are as described above.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A semiconductor optical device, comprising:
   a semiconductor substrate;
   a compound semiconductor layer on the semiconductor substrate, the compound semiconductor layer having a mesa portion extending in a stripe shape in a first direction, the compound semiconductor layer having a pedestal portion adjacent to the mesa portion in a second direction perpendicular to the first direction;
   an additional insulating film on the pedestal portion of the compound semiconductor layer, the additional insulating film having an upper surface and a side surface at an inner obtuse angle between the upper surface and the side surface;
   a passivation film covering the compound semiconductor layer and the additional insulating film except at least part of the mesa portion, the passivation film having a protrusion raised by overlapping with the additional insulating film;
   a mesa electrode on the at least part of the mesa portion;
   a pad electrode on the passivation film within the protrusion; and
   an extraction electrode on the passivation film, the extraction electrode being continuous within and outside the protrusion, the extraction electrode connecting the pad electrode and the mesa electrode, the extraction electrode being narrower in width than the pad electrode.

2. The semiconductor optical device of claim 1, wherein the passivation film includes a first portion in contact with the upper surface of the additional insulating film, and a second portion in contact with the side surface of the additional insulating film and lower than the first portion.

3. The semiconductor optical device of claim 2, wherein the first portion and the second portion are integrally continuous without a break entirely.

4. The semiconductor optical device of claim 2, wherein the first portion and the second portion are at least partially separated.

5. The semiconductor optical device of claim 4, wherein the first portion is completely separated from the second portion and is located within the upper surface of the additional insulating film.

6. The semiconductor optical device of claim 1, wherein at least one of the passivation film or the additional insulating film is formed of some laminated layers.

7. The semiconductor optical device of claim 1, wherein the passivation film is equivalent in thickness to the additional insulating film.

* * * * *